United States Patent
Hong et al.

(10) Patent No.: US 10,049,748 B2
(45) Date of Patent: Aug. 14, 2018

(54) SEMICONDUCTOR MEMORY DEVICE AND METHOD FOR PROGRAM OPERATION HAVING PROGRAM LOOPS BY STEP VOLTAGE

(71) Applicant: SK hynix Inc., Gyeonggi-do (KR)

(72) Inventors: Yong Hwan Hong, Gyeonggi-do (KR); Byung Ryul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/582,103

(22) Filed: Apr. 28, 2017

(65) Prior Publication Data
US 2018/0090209 A1    Mar. 29, 2018

(30) Foreign Application Priority Data
Sep. 23, 2016    (KR) ......................... 10-2016-0122219

(51) Int. Cl.
G11C 16/12    (2006.01)
(52) U.S. Cl.
CPC .................................. G11C 16/12 (2013.01)
(58) Field of Classification Search
CPC ...... G11C 16/12; G11C 16/0483; G11C 16/10
USPC .................................................... 365/185.19
See application file for complete search history.

(56) References Cited

U.S. PATENT DOCUMENTS

| | | | |
|---|---|---|---|
| 7,130,210 B2* | 10/2006 | Bathul | G11C 11/5671 365/100 |
| 9,245,645 B2* | 1/2016 | Srinivasan | G11C 16/3459 |
| 9,343,141 B2* | 5/2016 | Pang | G11C 11/5628 |
| 2006/0092703 A1* | 5/2006 | Chae | G11C 16/10 365/185.18 |
| 2010/0246258 A1* | 9/2010 | Yun | G11C 11/5621 365/185.03 |
| 2011/0103151 A1* | 5/2011 | Kim | G11C 11/5628 365/185.19 |
| 2012/0075931 A1* | 3/2012 | Yuh | G11C 11/5628 365/185.17 |
| 2013/0039130 A1* | 2/2013 | Lee | G11C 11/5628 365/185.19 |
| 2015/0146484 A1* | 5/2015 | Lee | G11C 11/5628 365/185.03 |

(Continued)

FOREIGN PATENT DOCUMENTS

| | | |
|---|---|---|
| KR | 1020070013601 | 1/2007 |
| KR | 1020100131717 | 12/2010 |

*Primary Examiner* — Vu Le
*Assistant Examiner* — Sung Cho
(74) *Attorney, Agent, or Firm* — IP & T Group LLP

(57) ABSTRACT

Provided herein are a semiconductor memory device and a method of operating the semiconductor memory device. The semiconductor memory device includes a memory cell array including a memory cell array including a plurality of memory cells, a peripheral circuit configured to perform a program operation, which includes a plurality of program loops, on selected memory cells among the plurality of memory cells and a control circuit configured to control the peripheral circuit so that a program voltage applied to a selected word line, to which the selected memory cells are coupled, is stepwisely increased from a program start voltage to a target program voltage by a step voltage, which is a voltage increment of the program voltage, during a preset time period of a respective program loop.

7 Claims, 12 Drawing Sheets

(56) References Cited

U.S. PATENT DOCUMENTS

| | | | |
|---|---|---|---|
| 2015/0262693 A1* | 9/2015 | Kondo | G11C 16/0483 |
| | | | 365/185.12 |
| 2016/0099059 A1* | 4/2016 | Chen | G11C 16/10 |
| | | | 365/185.17 |
| 2017/0256320 A1* | 9/2017 | Lang | G11C 16/26 |

* cited by examiner

SEMICONDUCTOR MEMORY DEVICE AND METHOD FOR PROGRAM OPERATION HAVING PROGRAM LOOPS BY STEP VOLTAGE

CROSS-REFERENCE TO RELATED APPLICATION

The present application claims priority under 35 U.S.C. § 119(a) to Korean patent application number 10-2016-0122219, filed on Sep. 23, 2016, the entire disclosure of which is incorporated herein by reference in its entirety.

BACKGROUND

Field of Invention

Various embodiments of the present disclosure relate to an electronic device, and more particularly, to a semiconductor memory device and a method for operating the semiconductor memory device.

Description of Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

Various embodiments of the present disclosure are directed to a semiconductor memory device with improved reliability, and a method of operating the semiconductor memory device.

One embodiment of the present disclosure provides a semiconductor memory device, including a memory cell array including a plurality of memory cells; a peripheral circuit configured to perform a program operation, which includes a plurality of program loops, on selected memory cells among the plurality of memory cells; and a control circuit configured to control the peripheral circuit so that a program voltage applied to a selected word line, to which the selected memory cells are coupled, is stepwisely increased from a program start voltage to a target program voltage by a step voltage, which is a voltage increment of the program voltage, during a preset time period of a respective program loop.

The present disclosure provides a method of operating a semiconductor memory device, including applying a pass voltage to all word lines; when a voltage of the word lines reach the pass voltage, applying a program start voltage higher than the pass voltage to a selected word line among the word lines; and when the voltage of the selected word line reaches the program start voltage, applying a program voltage to the selected word line during a preset time period of each of a plurality of program loops, wherein the program voltage is stepwisely increased from the program start voltage to a target program by a step voltage, which is a voltage increment of the program voltage, during the preset time period.

BRIEF DESCRIPTION OF THE DRAWINGS

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
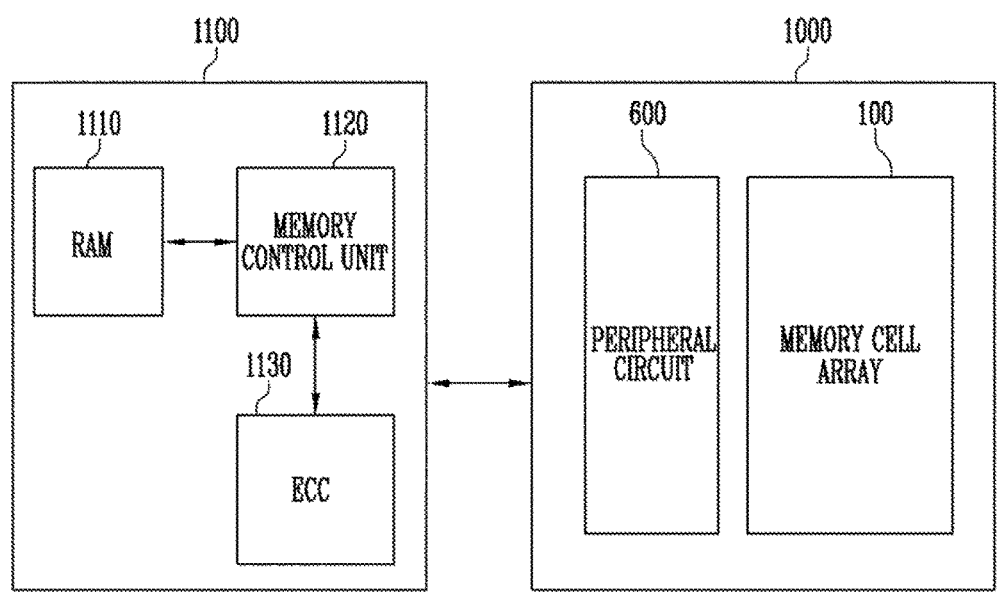
FIG. 1 is a block diagram illustrating a configuration of a memory system.

Hereinafter, embodiments will be described in greater detail with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "Include/comprise" or "Including/comprising" used in the specification represents that one or more components, steps, operations, and elements exist or are added.

Furthermore, unless defined otherwise, all the terms used in this specification including technical and scientific terms have the same meanings as would be generally understood by those skilled In the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. Alternatively, "directly connected/directly coupled" refers to one component directly coupling another component without an intermediate component.

Hereinafter, the present disclosure will be described in detail by describing exemplary embodiments of the present disclosure with reference to the attached drawings. Below, embodiments of the present disclosure will be described in detail with reference to the attached drawings.

FIG. 1 is a block diagram illustrating a configuration of a memory system.

A memory system 50 includes a semiconductor memory device 1000 and a controller 1100.

The semiconductor memory device 1000 takes many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 1000 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 1000 includes a memory cell array 100 and a peripheral circuit 600 for driving the memory cell array 100. The memory cell array 100 includes a plurality of nonvolatile memory cells.

The memory cell array 100 includes a plurality of memory blocks, which may be used such that the memory blocks are divided into system blocks and user blocks according to the use thereof.

In an embodiment, the memory cell array 100 may include a Content Addressable Memory (CAM) area. The CAM area may include a plurality of memory cells, which are included in at least one memory block. In the CAM area, various types of setup information required for the operation of the semiconductor memory device 1000 may be stored. For example, in the CAM area, conditions or other pieces of information which are set in relation to a data input/output operation may be stored. In an embodiment, in the CAM area, information about the number of read/write operations (Program/Erase (P/E) cycle), an erroneous column address, and an erroneous block address may be stored. In an embodiment, in the CAM area, option information required for the operation of the semiconductor memory device 1000, for example, program voltage information, read voltage information, erase voltage information, the thickness information of the gate oxide film of each cell, etc., may be stored.

When power is supplied to the semiconductor memory device 1000, information stored in the CAM area is read by the peripheral circuit 600, and the peripheral circuit 600 may control the memory cell array 100 so that the data input/output operation on the memory cells is performed under the set conditions, based on the read information.

The peripheral circuit 600 is operated under the control of the controller 1100. The peripheral circuit 600 may program data in the memory cell array 100 under the control of the controller 1100. The peripheral circuit 600 may be operated such that data is read from the memory cell array 100 and data in the memory cell array 100 is erased.

In various embodiments, the read operation and the program operation of the semiconductor memory device 1000 may be performed on a page basis. The erase operation of the semiconductor memory device 1000 may be performed on a memory block basis.

During a program operation, the peripheral circuit 600 may receive a command indicating a program operation, a physical block address PBA, and write data from the controller 1100. The peripheral circuit 600 may program data in a selected page when a single memory block and a single page included in the corresponding memory block are selected in response to the physical block address PBA.

During a read operation, the peripheral circuit 600 may receive a command indicating a read operation hereinafter referred to as a "read command" and a physical block address PBA from the controller 1100. The peripheral circuit 600 may read data from a single memory block selected in response to the physical block address PBA and from a page included in the memory block, and may output the read data hereinafter referred to as "page data" to the controller 1100.

During an erase operation, the peripheral circuit 600 may receive a command indicating an erase operation and a physical block address PBA from the controller 1100. The physical block address PBA may specify a single memory block. The peripheral circuit 600 may erase data stored in the memory block corresponding to the physical block address PBA.

The controller 1100 controls the overall operation of the semiconductor memory device 1000. The controller 1100 may access the semiconductor memory device 1000 in response to a request from an external host. The controller 1100 may provide a command to the semiconductor memory device 1000 in response to the request from the external host.

In an embodiment, the controller 1100 may control the semiconductor memory device 1000 so that a program operation, a read operation or an erase operation is performed. In the program operation, the controller 1100 may provide the program command, the address and the data to the semiconductor memory device 1000 through a channel. In the read operation, the controller 1100 may provide the read command and the address to the semiconductor memory device 1000 through the channel. In the erase operation, the controller 1100 may provide the erase command and the address to the semiconductor memory device 1000 through the channel.

The controller 1100 may include a Random Access Memory (RAM) 1110, a memory control unit 1120, and an error correcting code (ECC) circuit 1130.

The RAM 1110 is operated under the control of the memory control unit 1120 and may be used as a work memory, a buffer memory, a cache memory, or the like. When the RAM 1110 is used as the work memory, data processed by the memory control unit 1120 may be temporarily stored. When the RAM 1110 is used as the buffer memory, the RAM may be used to buffer data that is to be transmitted from a host (not shown) to the semiconductor memory device 1000 or from the semiconductor memory device 1000 to the host (not shown).

The memory control unit 1120 is configured to control a read operation, a program operation, an erase operation and a background operation of the semiconductor memory device 1000. The memory control unit 1120 is configured to run firmware for controlling the semiconductor memory device 1000.

The memory control unit 1120 may perform a function of a Flash Translation Layer (FTL). The memory control unit 1120 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The ECC circuit 1130 generates parity that is an ECC for data to be programmed. Further, during a read operation, the ECC circuit 1130 may correct an error from read page data using the parity. The ECC circuit 1130 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the ECC circuit 1130 may correct errors from read page data. When a number of error bits exceeding the number of correctable bits are included in the read page data, decoding may fail. When a number of error bits is less than or equal to the number of correctable bits are included in the page data, decoding may succeed.

A success in decoding indicates that the corresponding read command has passed. A failure in decoding indicates that the corresponding read command has failed. When decoding succeeds, the controller 1100 outputs error-corrected page data to the host.

Although not shown in the drawing, the controller 1100 may further include a memory interface for communicating with the semiconductor memory device 1000. The memory interface includes a protocol for communicating with the semiconductor memory device 1000. For example, the memory interface may include at least one of flash interfaces such as a NAND interface and a NOR interface.

The controller 1100 may further include a host interface (not shown) to perform data exchange between the host and the controller 1100. The host interface includes protocols required for communication between the host and the controller 1100. In an exemplary embodiment, the controller 1100 is configured to communicate with an external system such as, a host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 2:
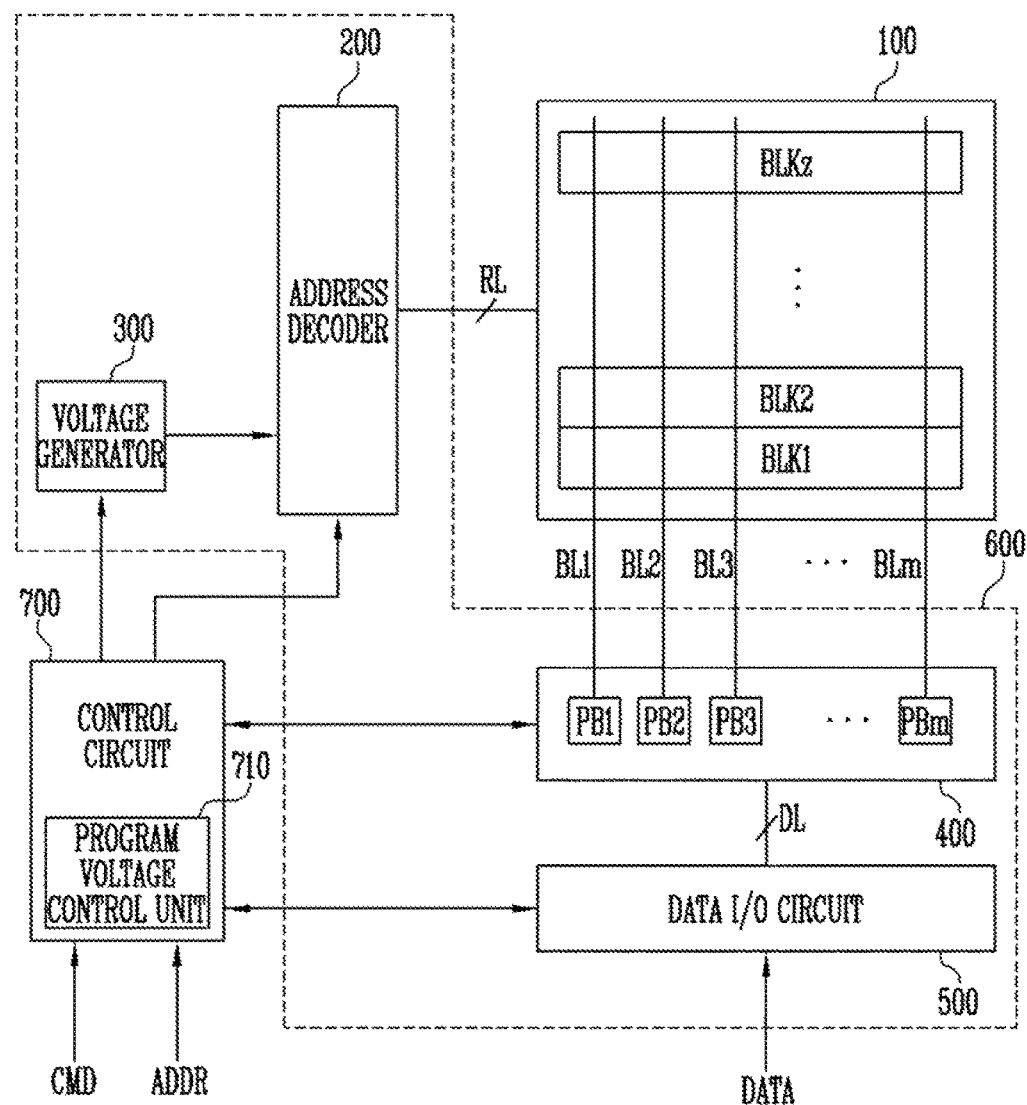
FIG. 2 is a block diagram illustrating a semiconductor memory device according to an embodiment of the present disclosure.

FIG. 2 is a block diagram illustrating a semiconductor memory device according to an embodiment of the present disclosure.

Figure 3:
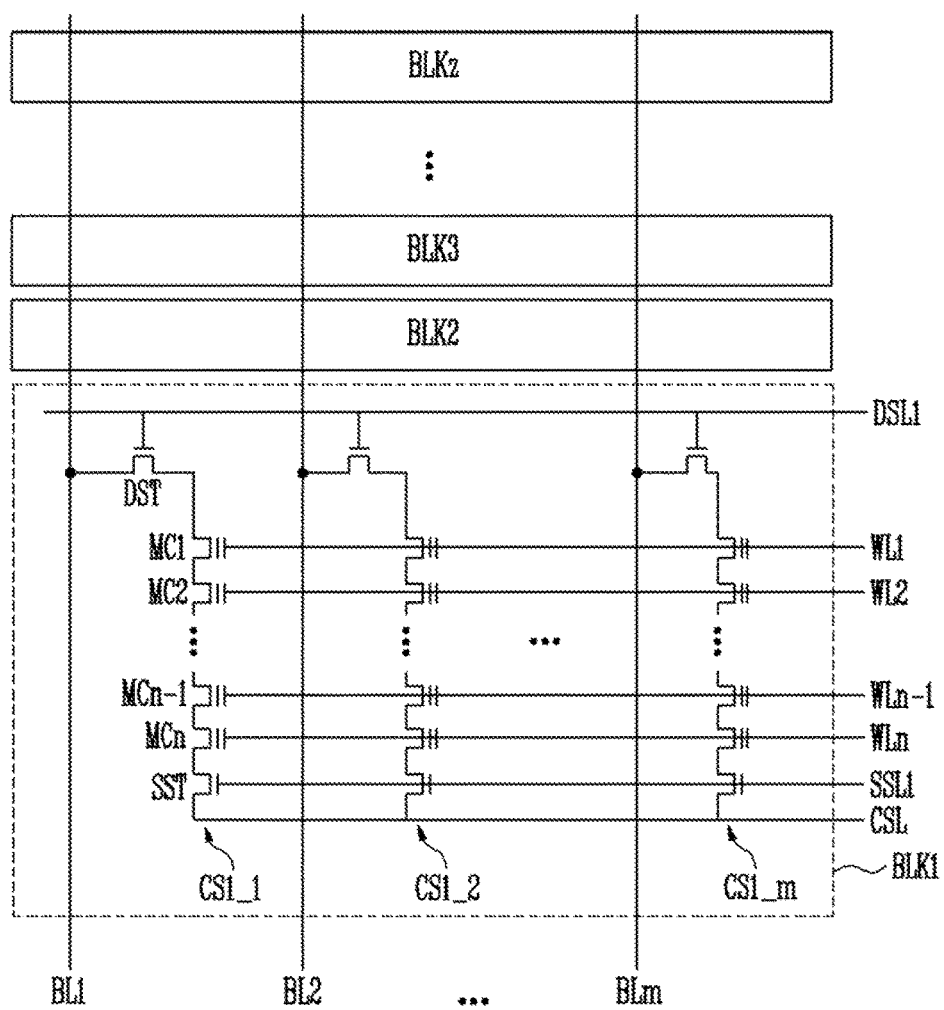
FIG. 3 is a diagram illustrating a structure of the memory cell array of FIG. 2.

FIG. 3 is a diagram illustrating the structure of the memory cell array 100 of FIG. 2.

Referring to FIG. 2, a semiconductor memory device 1000 includes the memory cell array 100, a peripheral circuit 600, and a control circuit 700.

The memory cell array 100 includes a plurality of memory blocks BLK1 to BLKz. The plurality of memory blocks BLK1 to BLKz are coupled to an address decoder 200 through row lines RL. The memory blocks BLK1 to BLKz are coupled to a read and write circuit 400 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 100 is composed of a plurality of pages.

The memory cells of the semiconductor memory device 1000 may be each implemented as a single level cell (SLC) capable of storing a single data bit, a multi-level cell (MLC) capable of storing two data bits, a triple-level cell (TLC) capable of storing three data bits, or a quad-level cell (QLC) capable of storing four data bits.

Referring to FIG. 3, first to z-th memory blocks BLK1 to BLKz included in a memory cell array 100_1 are coupled in common to first to m-th bit lines BL1 to BLm. In FIG. 3, for the convenience of description, elements included in the first memory block BLK1, among the plurality of memory blocks BLK1 to BLKz, are illustrated, and respective elements included in remaining memory blocks BLK2 to BLKz are omitted. It will be understood that each of the remaining memory blocks BLK2 to BLKz is configured in the same way as the first memory block BLK1.

The memory block BLK1 includes a plurality of cell strings CS1_1 to CS1_$m$. The first to m-th cell strings CS1_1 to CS1_$m$ are coupled to the first to m-th bit lines BL1 to BLm, respectively.

Each of the first to m-th cell strings CS1_1 to CS1_$m$ includes a drain select transistor DST, a plurality of series-connected memory cells MC1 to MCn, and a source select transistor SST. The drain select transistor DST is coupled to a drain select line DSL1. The first to n-th memory cells MC1 to MCn are coupled to first to n-th word lines WL1 to WLn, respectively. The source select transistor SST is coupled to a source select line SSL1. A drain of the drain select transistor DST is coupled to the corresponding bit line. Drain select transistors of the first to m-th cell strings CS1_1 to CS1_m are coupled to the first to m-th bit lines BL1 to BLm, respectively. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 200. The common source line CSL is controlled by the control circuit 700. The first to m-th bit lines BL1 to BLm are controlled by a read and write circuit 400.

Referring back to FIG. 2, the peripheral circuit 600 may include the address decoder 200, a voltage generator 300, the read and write circuit 400, and a data input/output (I/O) circuit 500.

The peripheral circuit 600 drives the memory cell array 100 under the control of the control circuit 700. For example, the peripheral circuit 600 may drive the memory cell array 100 so that a program operation, a read operation, and an erase operation are performed under the control of the control circuit 700.

The address decoder 200 is coupled to the memory cell array 100 through the row lines RL. The address decoder 200 is configured to be operated in response to the control of the control circuit 700. The address decoder 200 receives an address ADDR from the control circuit 700 through an input/output buffer (not shown) provided in the semiconductor memory device 1000.

The address decoder 200 is configured to decode a block address of the received address ADDR. The address decoder 200 selects at least one memory block from among the memory blocks BLK1 to BLKz in response to the decoded block address. The address decoder 200 is configured to decode a row address of the received address ADDR. The address decoder 200 may select at least one word line of the selected memory block by applying voltages supplied from the voltage generator 300 to at least one word line WL in response to the decoded row address.

During a program operation, the address decoder 200 may apply a program voltage to the selected word line and apply a pass voltage having a level lower than that of the program voltage to unselected word lines. During a program verify operation, the address decoder 200 may apply a verification voltage to a selected word line and apply a verification pass voltage higher than the verification voltage to unselected word lines.

During a read operation, the address decoder 200 may apply a read voltage to a selected word line and apply a pass voltage higher than the read voltage to unselected word lines.

In an embodiment, an erase operation of the semiconductor memory device 1000 is performed on a memory block basis. During an erase operation, the address ADDR inputted to the semiconductor memory device 1000 includes a block address. The address decoder 200 may decode the block address and select a single memory block in response to the decoded block address. During an erase operation, the address decoder 200 may apply a ground voltage to a word line coupled to the selected memory block. In an embodiment, the address decoder 200 may include a block decoder, a word line decoder, an address buffer, etc.

The voltage generator 300 is configured to generate a plurality of voltages using an external supply voltage provided to the semiconductor memory device 1000. The voltage generator 300 is operated under the control of the control circuit 700.

In an embodiment, the voltage generator 300 may generate an internal supply voltage by regulating the external supply voltage. The internal supply voltage generated by the voltage generator 300 is used as an operating voltage of the semiconductor memory device 1000.

In an embodiment, the voltage generator 300 may generate a plurality of voltages using the external supply voltage or the internal supply voltage. For example, the voltage generator 300 may include a plurality of pumping capacitors for receiving the internal supply voltage and may generate a plurality of voltages by selectively activating the pumping capacitors under the control of the control circuit 700. The generated voltages are applied to the word lines selected by the address decoder 200.

The read and write circuit 400 includes first to m-th pages buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control circuit 700.

The first to m-th page buffers PB1 to PBm perform data communication with the data I/O circuit 500. During a program operation, the first to m-th page buffers PB1 to PBm receive data DATA to be stored through the data I/O circuit 500 and data lines DL.

During a program operation, the first to m-th page buffers PB1 to PBm may transfer the data DATA, received through the data I/O circuit 500, to selected memory cells through the bit lines BL1 to BLm when a program pulse is applied to each selected word line. The memory cells in the selected page are programmed based on the transferred data DATA. Memory cells coupled to a bit line to which a program permission voltage for example, a ground voltage is applied, may have increased threshold voltages. Threshold voltages of memory cells coupled to a bit line to which a program prohibition voltage for example, a supply voltage is applied, may be maintained. During a program verify operation, the first to m-th page buffers read page data from the selected memory cells through the bit lines BL1 to BLm.

During a read operation, the read and write circuit 400 reads data DATA from the memory cells in the selected page through the bit lines BL, and outputs the read data DATA to the data I/O circuit 500.

During an erase operation, the read and write circuit 400 may float the bit lines BL. In an embodiment, the read and write circuit 400 may include a column select circuit.

The data I/O circuit 500 is coupled to the first to m-th page buffers PB1 to PBm through the data lines DL. The data I/O circuit 500 is operated under the control of the control circuit 700. During a program operation, the data I/O circuit 500 receives data DATA to be stored from an external controller (not shown). During a read operation, the data I/O circuit 500 outputs the data, received from the first to m-th page buffers PB1 to PBm included in the read and write circuit 400, to the external controller.

The control circuit 700 is coupled to the address decoder 200, the voltage generator 300, the read and write circuit 400, and the data I/O circuit 500. The control circuit 700 may control the overall operation of the semiconductor memory device 1000. The control circuit 700 receives a command CMD and an address ADDR from the external controller. The control circuit 700 may control the peripheral circuit 600 in response to the command CMD. The control circuit 700 may control the address decoder 200, the voltage generator 300, the read and write circuit 400, and the data I/O circuit 500 so that an operation corresponding to the received command is performed. In an embodiment, the control circuit 700 may apply a high erase voltage Verase to the source line during an erase operation.

The control circuit 700 may further include a program voltage control unit 710.

The program voltage control unit 710 may control a program voltage VPGM that is applied to a selected word line during a program operation. During the program operation, the program voltage VPGM is applied to the selected word line, and a pass voltage VPASS having a level lower than that of the program voltage VPGM is applied to unselected word lines. Therefore, during the program operation, when the pass voltage is first applied to all word lines, and the voltages of the word lines reach the level of the pass voltage VPASS, the semiconductor memory device 1000 increases the voltage that is applied to the selected word line to the level of the program voltage VPGM.

The program operation of the semiconductor memory device 1000 may be performed by repeating one or more program loops (PGM Loops). A single program loop (PGM Loop) may include a program step of applying the program voltage VPGM and a program verify step of verifying a program state. At the program step, the program voltage VPGM is applied to the word line of selected memory cells.

In an embodiment, the semiconductor memory device 1000 may perform a program operation using an Incremental Step Pulse Programming (ISPP) scheme that gradually increases the program voltage whenever the program loop progresses.

In the program operation using the ISPP scheme, program voltages in respective program loops may have different target program voltages VPGM_TARGET. That is, whenever each program loop is executed, the level of a target program voltage VPGM_TARGET may be increased.

Furthermore, the threshold voltage of each memory cell may be determined depending on the level of the applied program voltage and the time duration for which the program voltage is applied. The threshold voltages of memory cells may differ from one another due to a difference in the relative locations of the memory cells from a bias source driver applying the program voltage to the memory cells. For example, the memory cells of a near word line, which is located closer to the address decoder 200, reaches the level of the target program voltage VPGM_TARGET faster than those of a far word line, which is located farther from the address decoder 200. As the relative location of the memory cell becomes greater, the time difference of reaching the level of the target program voltage VPGM_TARGET becomes greater, which causes and deepens distortion of the threshold voltages of memory cells. Such a distortion in the threshold voltage distribution may degrade reliability of the semiconductor memory device.

In accordance with an embodiment of the present disclosure, the semiconductor memory device 1000 applies a gradually increasing program voltage to the selected word line rather than directly applying the target program voltage VPGM_TARGET to the selected word line. More specifically, during the program operation, the program voltage control unit 710 may control the level of the program voltage VPGM so that a program start voltage VPGM_START is first applied to the selected word line and then, when the voltage of the selected word line reaches the program start voltage VPGM_START, a step voltage gradually reaching the target program voltage VPGM_TARGET for a preset time period is applied to the selected word line. This approach may differ from directly applying the target program voltage VPGM_TARGET corresponding to the current program loop to the selected word line after the voltage of the selected word line has reached the level of the program pass voltage VPASS. A method by which the semiconductor memory device 1000 controls the level of the program voltage VPGM applied to the selected word line so that a step voltage is gradually stepwisely increased for a preset time period from the program start voltage VPGM_START to the target program voltage VPGM_TARGET will be described in detail below with reference to FIGS. 6 to 12.

Figure 4:
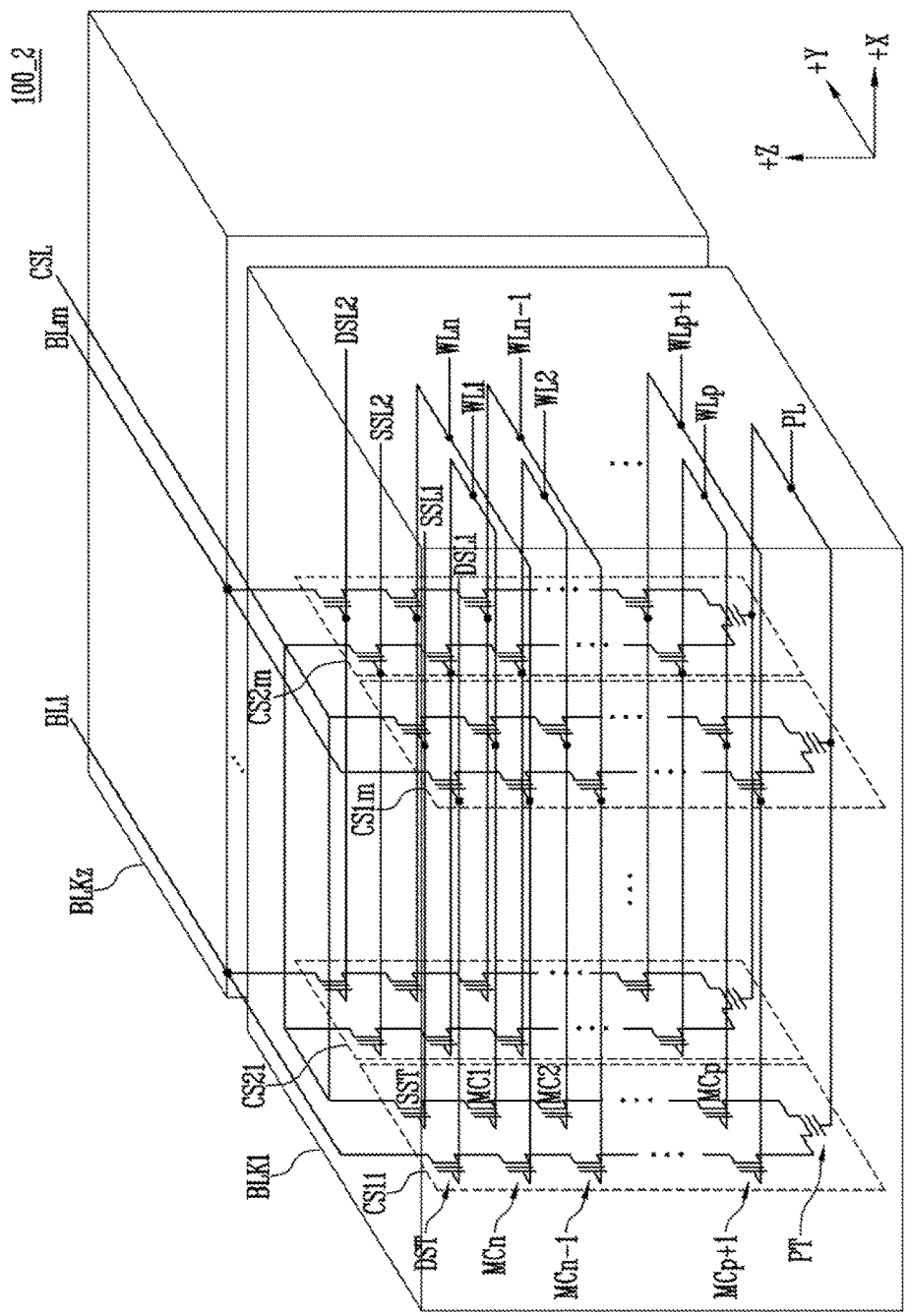
FIG. 4 illustrates another embodiment of the memory cell array of FIG. 2.

FIG. 4 is a diagram illustrating another embodiment of the memory cell array of FIG. 2.

Referring to FIG. 4, a memory cell array 100_2 includes a plurality of memory blocks BLK1 to BLKz. In FIG. 4, for the convenience of description, the internal configuration of the first memory block BLK1 is illustrated, and the internal configuration of remaining memory blocks BLK2 to BLKz is omitted. It will be understood that the second to z-th memory blocks BLK2 to BLKz are configured in the same manner as the first memory block BLK1.

Referring to FIG. 4, the first memory block BLK1 includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the first memory block BLK1, m cell strings are arranged in a row direction that is, a positive (+) X direction. In FIG. 4, two cell strings are shown as being arranged in a column direction that is, a positive (+) Y direction. However, this illustration is made for convenience of description, and it will be understood that three or more cell strings may be arranged in the column direction.

Each of the plurality of cell strings CS11 to CS1$m$ and CS21 to CS2$m$ Includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 4, source select transistors of cell strings CS11 to CS1$m$ in a first row are coupled to a first source select line SSL1. The source select transistors of cell strings CS21 to CS2$m$ in a second row are coupled to a second source select line SSL2.

In another embodiment, source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1 is improved.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Figure 5:
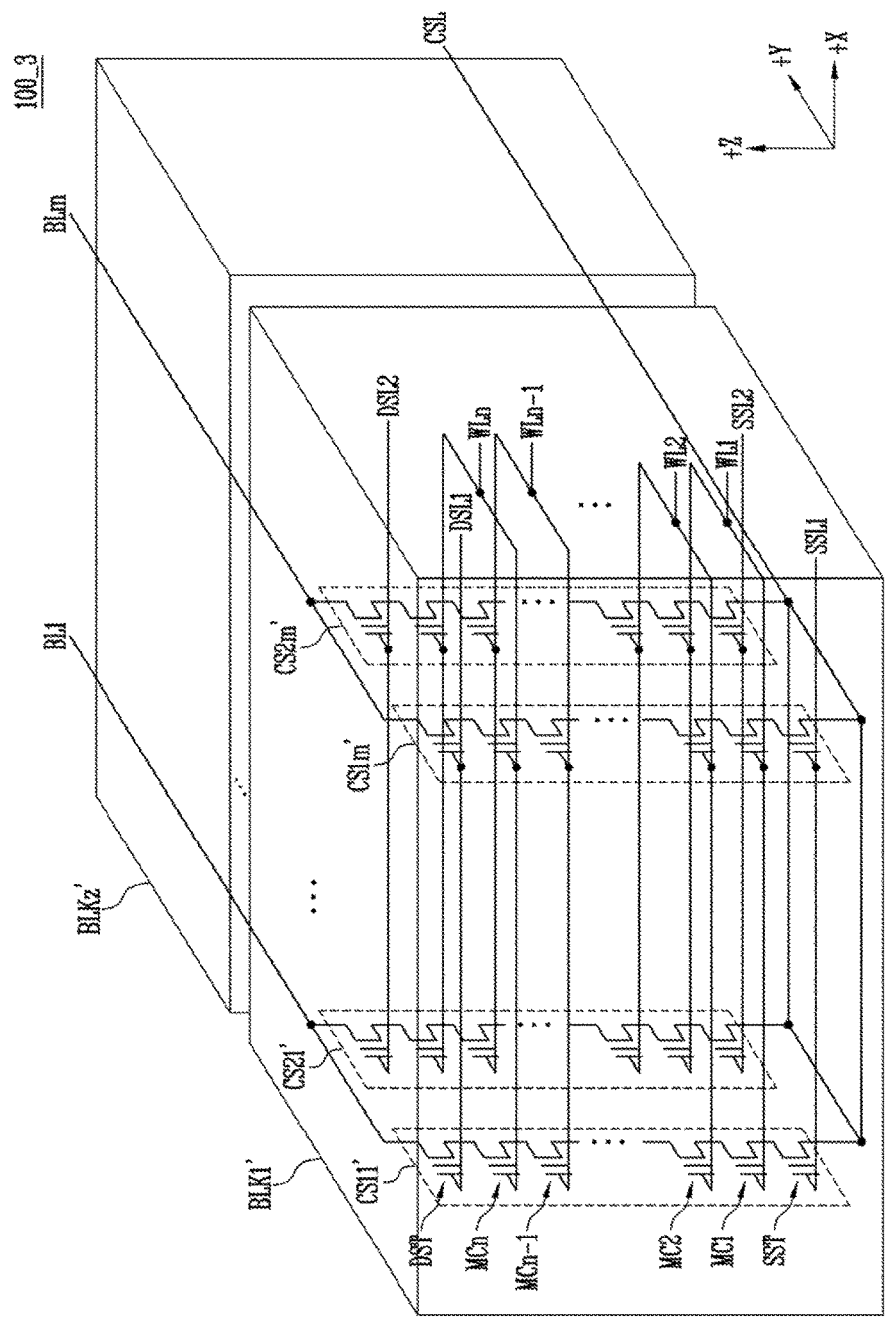
FIG. 5 illustrates a further embodiment of the memory cell array of FIG. 2.

FIG. 5 is a diagram illustrating a further embodiment of the memory cell array of FIG. 2.

Referring to FIG. 5, a memory cell array 100_3 includes a plurality of memory blocks BLK1' to BLKz'. In FIG. 5, for the convenience of description, the internal configuration of the first memory block BLK1' is illustrated, and the illustration of the internal configuration of remaining memory blocks BLK2' to BLKz' is omitted. It will be understood that the second to z-th memory blocks BLK2' to BLKz' are configured in the same manner as the first memory block BLK1'.

The first memory block BLK1' Includes a plurality of cell strings CS11' to CS1m' and CS21' to CS2m'. Each of the plurality of cell strings CS11' to CS1m' and CS21' to CS2m' is extended along a +Z direction. In the first memory block BLK1', m cell strings are arranged in a +X direction. In FIG. 5, two cell strings are shown as being arranged in a +Y direction. However, this configuration is made for the convenience of description, and it will be understood that three or more cell strings may be arranged in a column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In another embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1' is improved.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
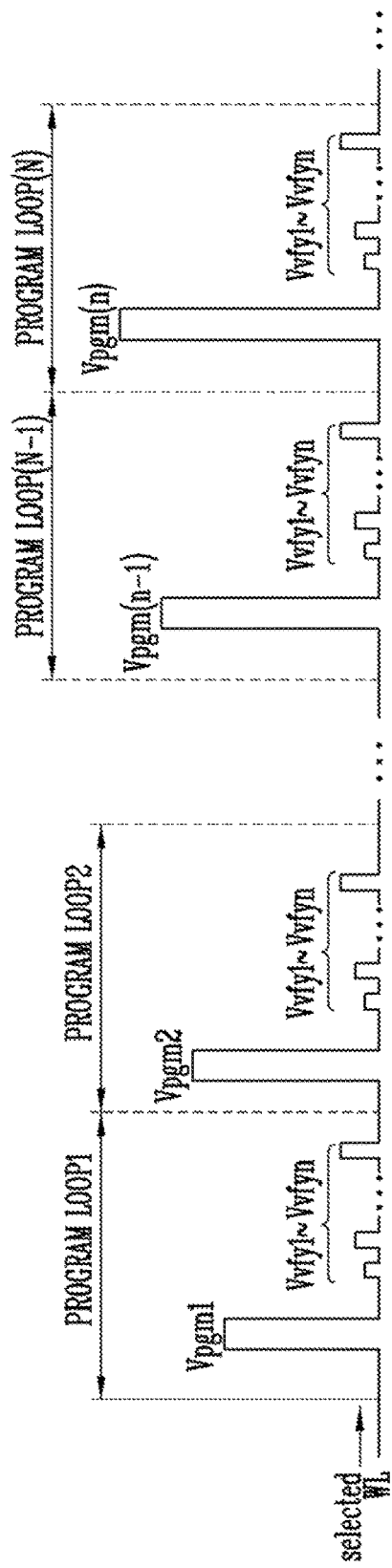
FIG. 6 is a diagram illustrating a program method using an ISPP scheme.

FIG. 6 is a diagram illustrating a program method using the ISPP scheme.

Referring to FIG. 6, a program operation of a semiconductor memory device may include one or more program loops. In FIG. 6, a case in which the total N number of program loops of the semiconductor memory device is illustrated. A single program loop may be divided into a program step at which a program voltage Vpgm is applied, and a program verify step.

During N program loops, the semiconductor memory device applies program voltage pulses Vpgm1 to Vpgm(n) to a selected word line WL each followed by applying respective verification voltages Vvfy1 to Vvfyn for each of first to N-th program states. Simultaneously with the application of the voltages, the semiconductor memory device may apply a program pass voltage and a read pass voltage to unselected word lines.

In an embodiment, the number of verification voltages used at the verify step may be set differently according to the program method. That is, the number of verification voltages used at the verify step is not limited by the embodiment of FIG. 6.

In a program operation using the ISPP scheme, as the number of program loops is increased, the program voltages Vpgm1 to Vpgm(n) may be gradually increased by a predetermined voltage level. For example, a second program voltage Vpgm2 applied in program loop 2 may be greater than the first program voltage Vpgm1 applied in program loop 1 by the predetermined voltage level. In an embodiment, the levels of the program voltages Vpgm1 to Vpgm(n) may be the levels of the target program voltage VPGM_TARGET in respective program loops.

Figure 7:
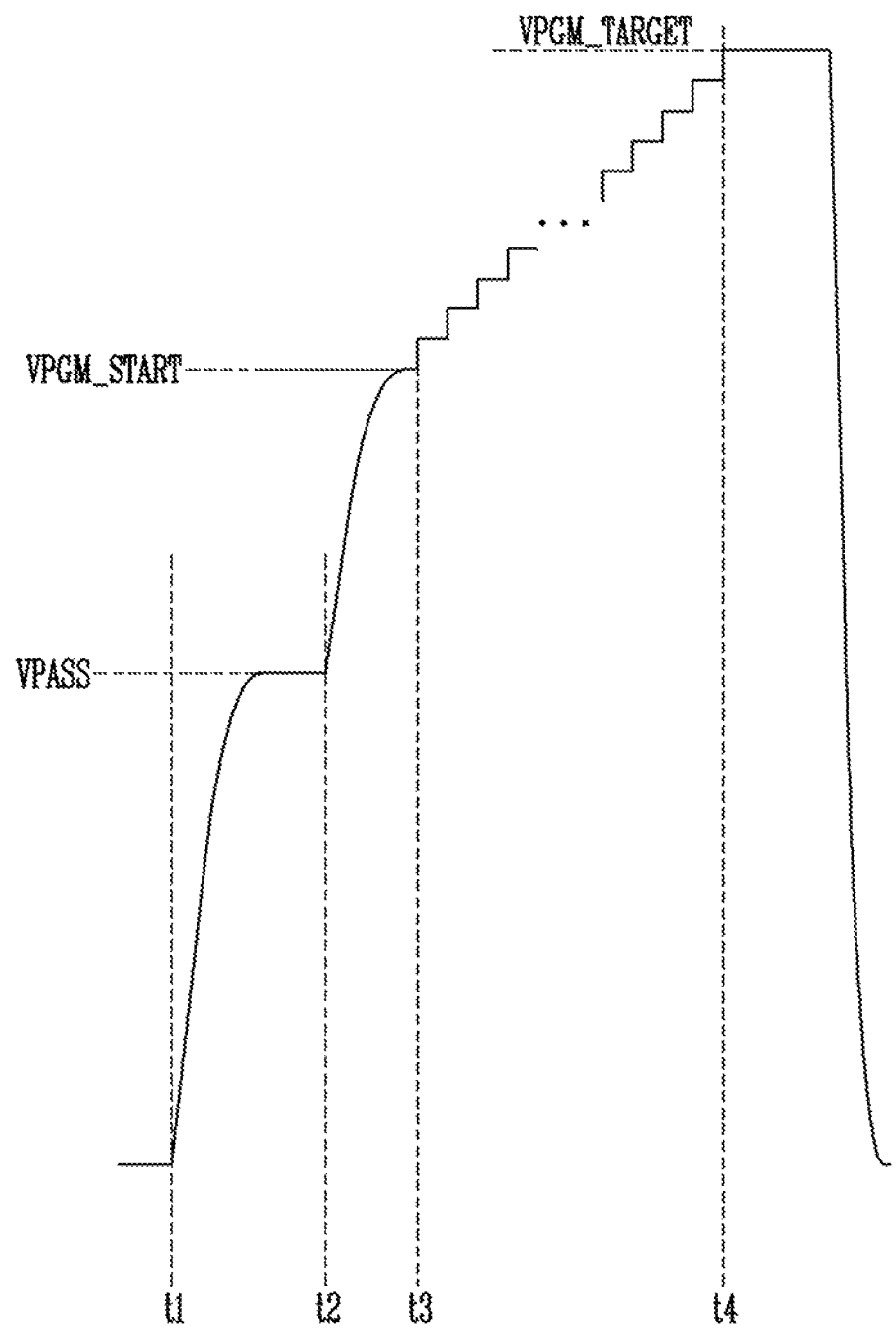
FIG. 7 is a diagram for illustrating a program voltage applied to a selected word line in a single program loop.

FIG. 7 is a diagram illustrating a program voltage applied to a selected word line in a single program loop.

FIG. 7 illustrates a program voltage VPGM applied by the semiconductor memory device to a selected word line in a program operation.

During the program operation, the program voltage VPGM is applied to the selected word line, and a pass voltage VPASS having a level lower than that of the program voltage VPGM is applied to unselected word lines. During the program operation, the semiconductor memory device first applies the pass voltage VPASS to all word lines, and increases the voltage applied to the selected word line to the level of the program voltage VPGM when the voltages of all word lines reach the level of the pass voltage VPASS.

More specifically, at time t1, the semiconductor memory device may apply the pass voltage VPASS to all word lines. Due to the pass voltage VPASS applied at time t1, the voltages of all word lines may reach the level of the pass voltage VPASS when time t2 is reached, then the voltages of all word lines may have the level of the pass voltage VPASS.

At time t2, the semiconductor memory device may apply a program start voltage VPGM_START to a selected word line. The level of the program start voltage VPGM_START may have the same value in all program loops.

When the program start voltage VPGM_START is applied to the selected word line at time t2, the potential of the selected word line may be increased. At time t3, the potential of the selected word line may reach the level of the program start voltage VPGM_START.

The semiconductor memory device may perform control such that, during an interval between time t3 and time t4, the voltage applied to the selected word line is stepwisely increased from the program start voltage VPGM_START to a target program voltage VPGM_TARGET.

In a program operation using the ISPP scheme, the level of the target program voltage VPGM_TARGET is increased as the number of program loops is increased. Therefore, in the semiconductor memory device, as the number of program loops is increased, an incremental gradient of the voltage that is applied to the selected word line may be further increased during the interval between time t3 and time t4.

Figure 8:
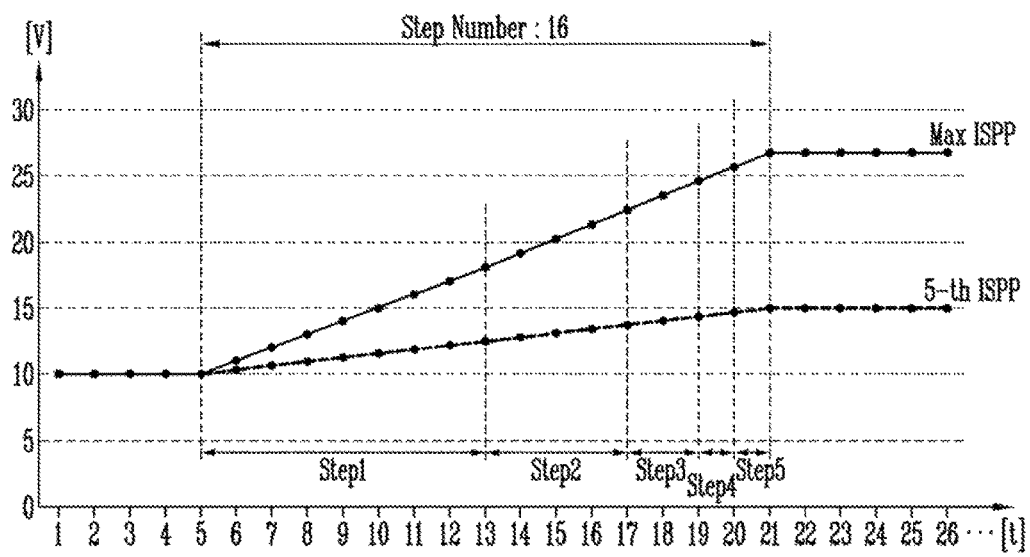
FIG. 8 is a diagram illustrating a program voltage control method according to an embodiment of the present disclosure.

FIG. 8 is a diagram illustrating a program voltage control method according to an embodiment of the present disclosure.

Referring to FIG. 8, a horizontal axis of a graph indicates steps (t). A single step may have a time length corresponding to one of one period and a half period of a micro clock MC_CK of the semiconductor memory device. A vertical axis of the graph indicates the magnitude (V) of a program voltage.

For the convenience of description, in FIG. 8, it is presumed that the voltage of the selected word line reaches a program start voltage VPGM_START at a time at which a step count is 5 for example, t=5: that is, when time passes to reach the 5$^{th}$ step.

The semiconductor memory device may control the program voltage so that the voltage of the selected word line reaches a target program voltage VPGM_TARGET from the program start voltage VPGM_START during a preset time period corresponding to the step count from 5 to 21 that is, during a preset time period corresponding to a number of the steps from the 5$^{th}$ step (t=5) to the 21$^{st}$ step (t=21).

More specifically, the semiconductor memory device may control the program voltage so that, when the program voltage applied to the selected word line reaches the program start voltage VPGM_START, the voltage of the selected word line is increased to reach the target program voltage VPGM_TARGET of the corresponding program loop during the preset time period corresponding to a plurality of steps such as, during the preset time period corresponding to the number of the steps from 5$^{th}$ step (t=5) to 21$^{st}$ step (t=21) as exemplified above.

In an embodiment, the program voltage may be controlled such that the program voltage is increased by a step voltage Vstep for each step during the preset time period. The length of the preset time period may stay constant for all program loops, which means that a constant time period is required in respective program loops for the voltage of the selected word line to reach the target program voltage VPGM_TARGET from the program start voltage VPGM_START. In an embodiment, the preset time period may correspond to a total of $2^N$ steps. FIG. 8 exemplifies the preset time period having a total of 16 steps that is, N=4.

The semiconductor memory device may count a number of remaining steps, which corresponds to a length of remaining time in the preset time period, at the start of each step interval during the preset time period starting from the program start voltage VPGM_START.

The step interval may be defined by following equation 1.

$$n^{th} \text{ step interval (unit: step)} = \begin{cases} 2^{N+1-n} - 2^{N-n}|_{n=1}^{N}, \\ 1|_{n=N+1} \end{cases} \quad \text{[Equation 1]}$$

where "n" is a natural number ranging from 1 to N+1

The respective step intervals may be obtained when the total of $2^N$ steps corresponding to the preset time period is given. For example, the preset time period having a total of 16 steps (=$2^N$ where N=4) and starting from the 5$^{th}$ step may include a first step interval of 8 (=$2^4-2^3$) steps starting from the 5$^{th}$ step, a second step interval of 4 (=$2^3-2^2$) steps starting from the 13$^{th}$ step, a third step interval of 2 (=$2^2-2^1$) steps starting from the 17$^{th}$ step, a fourth step interval of 1 (=$2^1-2^0$) step starting from the 19$^{th}$ step and a fifth step interval of 1 step starting from the 20$^{th}$ step, as exemplified in FIG. 8.

At the start of each step interval, the semiconductor memory device may update the step voltage Vstep based on the target program voltage VPGM_TARGET, the current program voltage of the selected word line and the counted number of remaining steps. Upon updating the step voltage Vstep, the program voltage may be increased by the updated step voltage at each step during the corresponding step interval.

At the start of each step interval, the semiconductor memory device may update the step voltage Vstep based on the target program voltage VPGM_TARGET, the current program voltage VCURRENT of the selected word line and the counted number of remaining steps, as the following equation 2:

$$Vstep(n) = \frac{(VPGM\_TARGET - VCURRENT)}{\text{REMAINING STEPS}}, \quad \text{[Equation 2]}$$

where "n" is a natural number ranging from 1 to N+1

For example, presuming that the total number of steps is $2^N$, when the step voltage is updated and the levels of the updated step voltage are represented by the following Table 1:

TABLE 1

| Magnitude of step voltage(Vstep(n)) | number of remaining steps | step interval (unit: step) |
| --- | --- | --- |
| Vstep(1) = (VPGM_TARGET − VPGM_START)/$2^N$ | $2^N$ | $1^{st}$ step interval ("Step1"): $2^N − 2^{N−1}$ |
| Vstep(2) = (VPGM_TARGET − VCURRENT)/$2^{N−1}$ | $2^{N−1}$ | $2^{nd}$ step interval ("Step2"): $2^{N−1} − 2^{N−2}$ |
| Vstep(3) = (VPGM_TARGET − VCURRENT)/$2^{N−2}$ | $2^{N−2}$ | $3^{rd}$ step interval ("Step3"): $2^{N−2} − 2^{N−3}$ |
| . | . | . |
| . | . | . |
| . | . | . |
| Vstep(N) = (VPGM_TARGET − VCURRENT)/$2^1$ | $2^1$ | $N^{th}$ step interval ("StepN"): $2^1 − 2^0$ |
| Vstep(N + 1) = (VPGM_TARGET − VCURRENT)/$2^0$ | $2^0$ | $(N + 1)^{th}$ step interval ("StepN + 1"): 1 |

Referring to Table 1, during a first step interval of $2^N$ minus $2^{N-1}$, the program voltage may be increased by a first step voltage Vstep1 at each step.

During a second step interval of $2^{N-1}$ minus $2^{N-2}$, the program voltage may be increased by a second step voltage Vstep2 at each step.

During a third step interval of $2^{N-2}$ minus $2^{N-3}$, the program voltage may be increased by a third step voltage Vstep3 at each step.

During a N-th step interval of $2^1$ minus $2^0$, the program voltage may be increased by a N-th step voltage Vstep(N) at each step.

During a (N+1)-th step interval of $2^0$, the program voltage may be increased by an (N+1)-th step voltage Vstep(N+1) at each step, and the voltage of the selected word line reaches the target program voltage VPGM_TARGET.

In FIG. 8, although a case in which the total number of steps included in the preset time period is 16 ($=2^N=2^4$), has been described by way of example, the number of multiple steps included in the preset time period in the embodiment of the present disclosure is not limited by the embodiment of FIG. 8.

Referring to FIG. 8, the total number of steps included in the preset time period is 16 ($=2^N$ where N=4).

During the first step interval Step1 of 8 steps ranging from the $5^{th}$ step to the $13^{th}$ step, the first step voltage Vstep1 applied to the selected word line is (VPGM_TARGET−VCURRENT(t=5))/16, and the program voltage is controlled to increase from the program start voltage VPGM_START that is, the voltage level of the $5^{th}$ step, by the first step voltage Vstep1 at each step.

During the second step interval Step2 of 4 steps ranging from the $13^{th}$ step to the $17^{th}$ step, the second step voltage Vstep2 applied to the selected word line is (VPGM_TARGET−VCURRENT(t=13))/8, and the program voltage is controlled to increase from the voltage level of the $13^{th}$ step by the second step voltage Vstep2 at each step.

During the third step interval Step3 of 2 steps ranging from the $17^{th}$ step to the $19^{th}$ step, the third step voltage Vstep3 applied to the selected word line is (VPGM_TARGET−VCURRENT(t=17))/4, and the program voltage is controlled to increase from the voltage level of the $17^{th}$ step by the third step voltage Vstep3 at each step.

During the fourth step interval Step4 of 1 step ranging from the $19^{th}$ step to the $20^{th}$ step, the fourth step voltage Vstep4 applied to the selected word line is (VPGM_TARGET−VCURRENT(t=19))/2, and the program voltage is controlled to increase from the voltage level of the $19^{th}$ step by the fourth step voltage Vstep4 at each step.

During the fifth step interval Step5 of 1 step ranging from the $20^{th}$ step to the $21^{st}$ step, the fifth step voltage Vstep5 applied to the selected word line is (VPGM_TARGET−VCURRENT(t=20))/1, and the program voltage is controlled to increase from the voltage level of the $20^{th}$ step by the fifth step voltage Vstep5 at each step.

Figure 9:
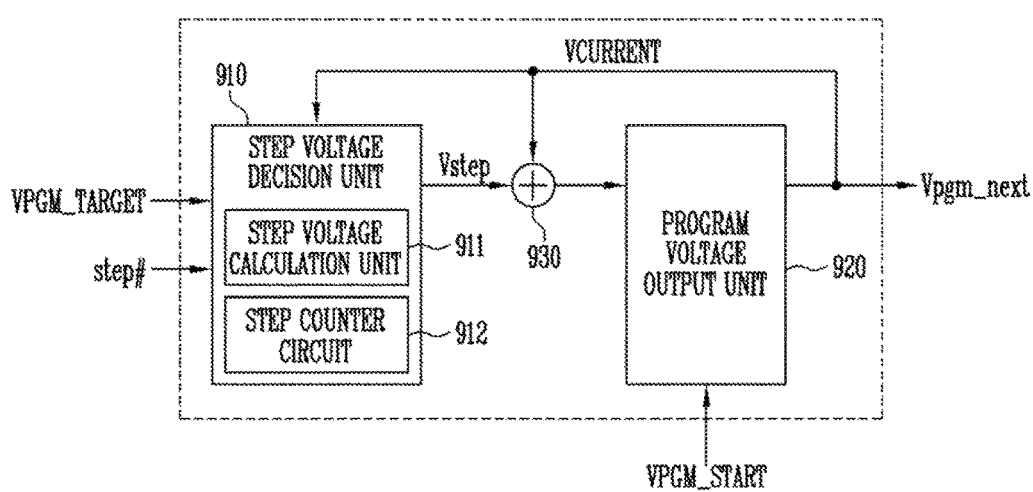
FIG. 9 is a diagram illustrating a structure of the program voltage control unit of FIG. 2.

FIG. 9 is a diagram illustrating the structure of the program voltage control unit 710 of FIG. 2.

Referring to FIG. 9, the program voltage control unit 710 may include a step voltage decision unit 910, a program voltage output unit 920, and an adder 930.

The step voltage decision unit 910 determines the step voltage according to equations 1 and 2 based on the target program voltage VPGM_TARGET, the current program voltage VCURRENT of the selected word line at the start of each step interval and the counted number of remaining steps. The step voltage decision unit 910 may receive the target program voltage VPGM_TARGET, the current program voltage VCURRENT of the selected word line and the total number of steps (step#) included in the preset time period, which is required for the program voltage to reach the target program voltage VPGM_TARGET from a program start voltage VPGM_START in a program loop.

The step voltage decision unit 910 may output the calculated step voltage Vstep to the adder 930.

The step voltage decision unit 910 may update at the start of each step interval the step voltage Vstep according to the current program voltage VCURRENT of the selected word line and the number of remaining steps at the start of each step interval (refer to equations 1 and 2). At the start of each step interval, the step voltage decision unit 910 may update the step voltage Vstep according to equations 1 and 2 based on the current program voltage VCURRENT, the target program voltage VPGM_TARGET, and the number of remaining steps. The step voltage decision unit 910 may output the updated step voltage Vstep to the adder 930.

For example, the step voltage decision unit 910 receives the total number of steps step# corresponding to the preset time period, and updates the step voltage Vstep at the start of each step interval defined as equation 1.

As exemplified above, the total number of steps step # corresponding to the preset time period is $2^N$. The step voltage decision unit 910 updates the step voltage Vstep at the start of each step interval defined by equation 1.

The program voltage output unit 920 may output a program voltage, which is increased by the step voltage Vstep for each clock, in response to an input clock signal. A program voltage Vpgm_next outputted from the program voltage output unit 920 at a next step may be the sum of the current program voltage Vpgm_current and the step voltage Vstep. The program voltage output unit 920 may feedback the program voltage Vpgm_next as the current program voltage Vpgm_current to both of the step voltage decision unit 910 and to the adder 930.

The adder 930 may add the feedbacked current program voltage Vpgm_current to the step voltage Vstep outputted from the step voltage decision unit 910, and may provide a resulting voltage to the program voltage output unit 920.

Figure 10:
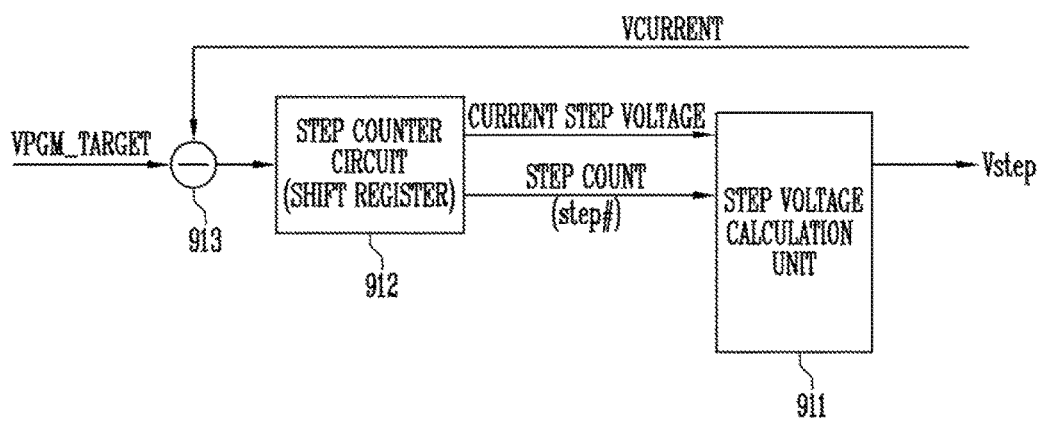
FIG. 10 is a diagram illustrating a structure of the step voltage decision unit of FIG. 9.

FIG. 10 is a diagram illustrating the structure of the step voltage decision unit 910.

Referring to FIG. 10, the step voltage decision unit 910 may include a step voltage calculation unit 911, a step counter circuit 912, and a subtractor 913.

The step voltage calculation unit 911 may receive a current step voltage and a number of remaining steps, and may calculate the step voltage Vstep. Presuming that the total number of steps step # corresponding to the preset time period is $2^N$, the step voltage calculation unit 911 may calculate the step voltage Vstep at the start of each step interval defined by equation 1.

The step voltage calculation unit 911 may select the step voltage Vstep to be outputted at the start of each step interval defined by equation 1, and may output the selected step voltage Vstep. The step voltage calculation unit 911 may calculate the step voltage Vstep according to equation 2.

The step counter circuit 912 may receive the total number of steps step # corresponding to the preset time period which is the time required for the program voltage to reach the target program voltage VPGM_TARGET from the program start voltage VPGM_START, and may count the number of remaining steps whenever each step progresses. In an embodiment, the step count circuit 912 may be implemented as a shift register.

The subtractor 913 may subtract the current program voltage VCURRENT from the target program voltage VPGM_TARGET, and may output a resulting value.

Figure 11:
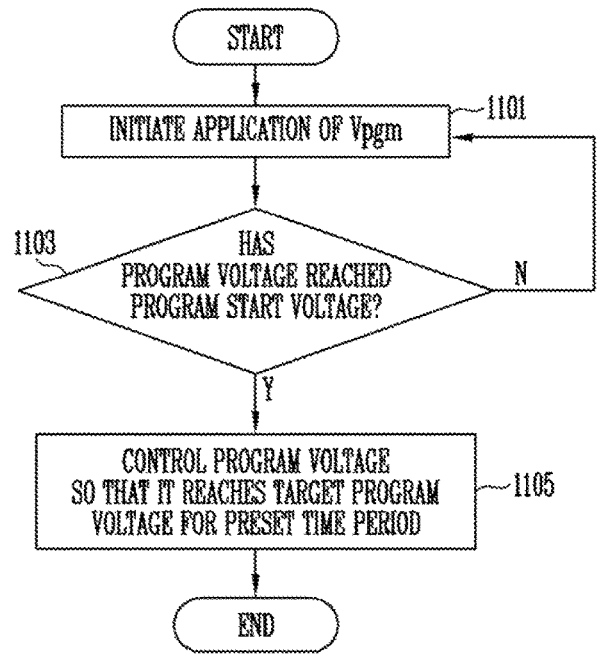
FIG. 11 is a flowchart illustrating an operation of a semiconductor memory device according to an embodiment of the present disclosure.

FIG. 11 is a flowchart for explaining the operation of the semiconductor memory device according to an embodiment of the present disclosure.

That is, FIG. 11 is a diagram for explaining a procedure in which a program voltage VPGM is applied to a selected word line during a single program loop.

Referring to FIG. 11, the semiconductor memory device applies the program voltage to the selected word line at step 1101. More specifically, during a program operation, the program voltage VPGM is applied to the selected word line, and a pass voltage VPASS having a level lower than that of the program voltage VPGM is applied to unselected word lines. Therefore, during the program operation, when the pass voltage VPASS is applied to all word lines and the voltages of the word lines reach the level of the pass voltage VPASS, the semiconductor memory device increases the voltage applied to the selected word line to the level of the program start voltage VPGM_START. At step 1101, after the voltage of the selected word line has reached the pass voltage VPASS, the program start voltage VPGM_START may be applied to the selected word line.

At step 1103, the semiconductor memory device may determine whether the voltage of the selected word line has reached the program start voltage VPGM_START. If it is determined that the voltage of the selected word line has reached the program start voltage VPGM_START, the process proceeds to step 1105.

At step 1105, the semiconductor memory device may control the program voltage so that the program voltage applied to the selected word line reaches the target program voltage VPGM_TARGET from the program start voltage VPGM_START during the preset time period. In detail, when the program voltage is applied to the selected word line, the semiconductor memory device applies a program voltage, which gradually increases by the step voltage Vstep from the program start voltage VPGM_START to the target program voltage VPGM_TARGET, to the selected word line.

Figure 12:
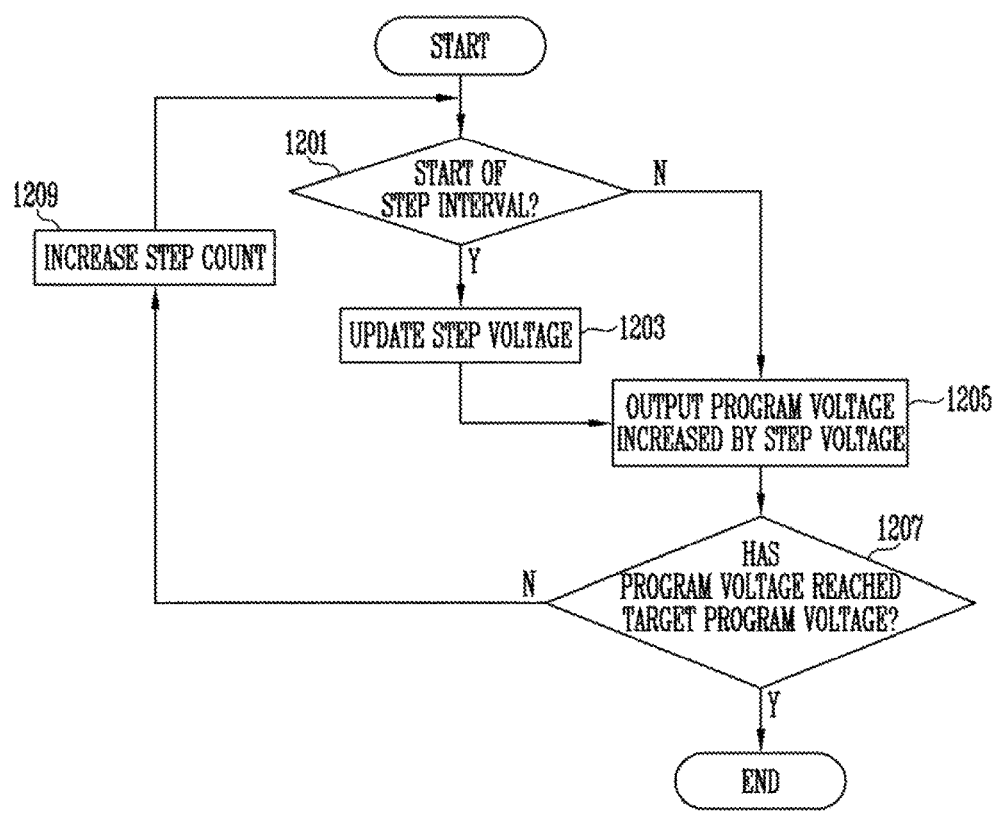
FIG. 12 is a flowchart illustrating a program voltage control method of FIG. 11.

FIG. 12 is a flowchart illustrating the program voltage control method of FIG. 11.

Referring to FIG. 12, the semiconductor memory device may determine whether it is the start of the step interval at step 1201. If it is determined that it is the start of the step interval, the process proceeds to step 1203, whereas if it is determined that it is not the start of the step interval, the process may proceed to step 1205. In an embodiment, the start of each step interval may be determined according to equation 1 when the total of $2^N$ steps corresponding to the preset time period is given.

At step 1203, the semiconductor memory device may update the step voltage Vstep based on the target program voltage VPGM_TARGET, the current program voltage VCURRENT of the selected word line and the counted number of remaining steps, by applying equation 2 at the start of each step interval, as described with reference to FIGS. 6 to 10.

At step 1205, the semiconductor memory device applies a program voltage, which is increased by the step voltage Vstep, to the selected word line.

At step 1207, the semiconductor memory device may determine whether the program voltage has reached the target program voltage VPGM_TARGET. In an embodiment, the semiconductor memory device may also determine whether the program voltage has reached the target program voltage VPGM_TARGET, by determining whether there is any remaining step since the program voltage reaches the target program voltage VPGM_TARGET at the last step among the total number of steps corresponding to the preset time period. If it is determined that the program voltage has not reach the target program voltage VPGM_TARGET or that there is any remaining step, the process may proceed to step 1209 of increasing the step count.

According to the embodiment of the present disclosure, the semiconductor memory device may apply a program voltage, which is stepwisely increased from the program start voltage to the target program voltage, during a program operation. Further, the step voltage may be updated at each start of step intervals having predetermined lengths (refer to equation 1). In this case, the program voltage may be increased such that an error scarcely occurs from a gradient in an ideal case. According to the embodiment of the present disclosure, a difference in the distribution of the threshold voltage between a near word line, which is located closer to a bias source driver for example, the address decoder 200, and a far word line, which is located farther to the bias source driver, attributable to parasitic loading due to the difference in the relative location of the word line to the bias source driver may be overcome. Further, digital logic may control the program voltage without requiring a divider and an adder, thus controlling the program voltage without increasing the area of a circuit.

Figure 13:
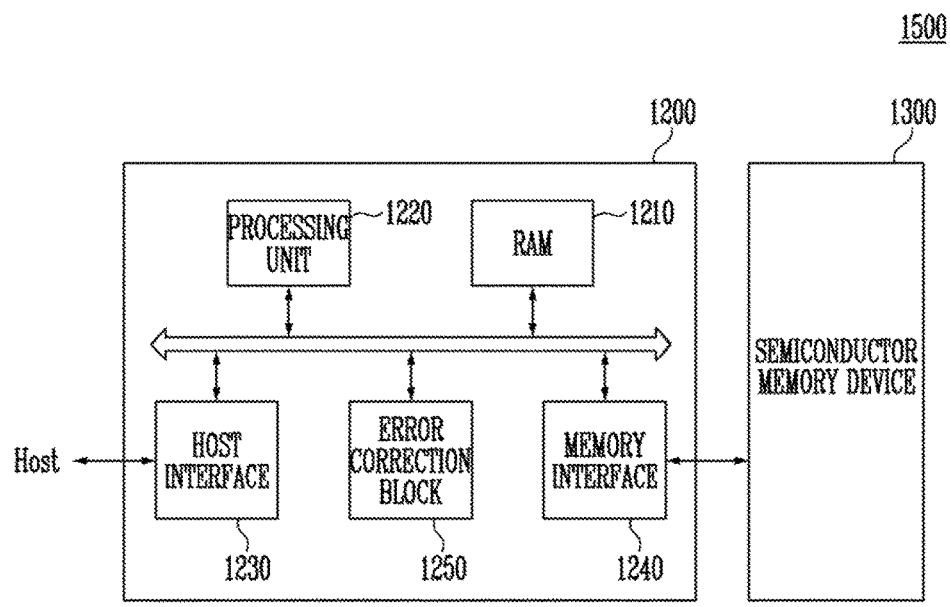
FIG. 13 is a block diagram illustrating a memory system including the semiconductor memory device of FIG. 2.

FIG. 13 is a block diagram illustrating a memory system including the semiconductor memory device of FIG. 2.

Referring to FIG. 13, a memory system 1500 includes a semiconductor memory device 1300 and a controller 1200.

The semiconductor memory device 1300 may have the same configuration and operation as the semiconductor memory device 1000 described with reference to FIG. 2. Hereinafter, repetitive descriptions will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls the overall operation of the controller 1200.

The processing unit 1220 is configured to randomize data received from the host Host. For example, the processing unit 1220 may randomize the data received from the host Host using a randomizing seed. The randomized data is provided, as data to be stored, to the semiconductor memory device 1300 and is then programmed in the memory cell array.

The processing unit 1220 is configured to derandomize the data received from the semiconductor memory device 1300 during a read operation. For example, the processing unit 1220 may derandomize the data received from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface includes a NAND interface or NOR interface.

The error correction block 1250 uses an error correcting code (ECC) to detect and correct an error in data received from the semiconductor memory device 1300.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data In a semiconductor memory. When the memory system is used as the SSD, an operation speed of the host Host coupled to the memory system may be phenomenally improved.

In another embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 14:
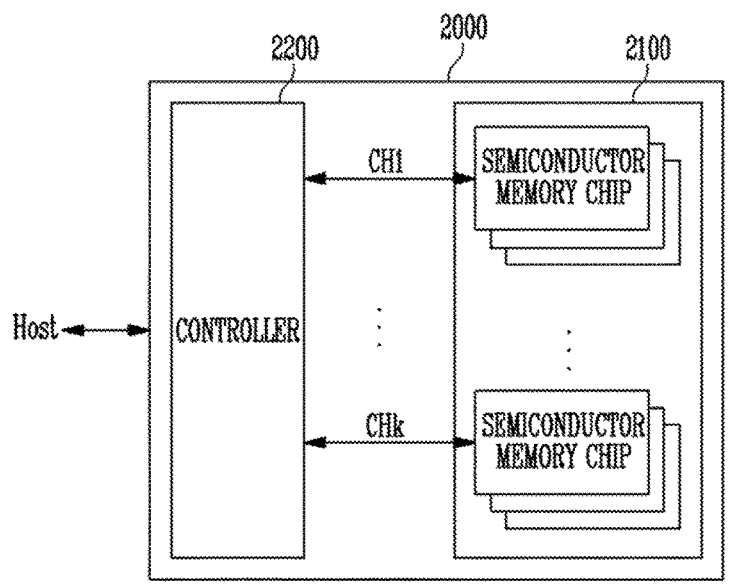
FIG. 14 is a block diagram illustrating an example of application of the memory system of FIG. 13.

FIG. 14 is a block diagram showing an example 2000 of application of the memory system of FIG. 13.

Referring to FIG. 14, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 14, it is illustrated that each of the plurality of groups communicates with the controller 2200 through first to k-th channels CH1 to CHk. Each semiconductor memory chip may have the same configuration and operation as those of an embodiment of the semiconductor memory device 1000 described with reference to FIG. 2.

Each group communicates with the controller 2200 through one common channel. The controller 2200 has the same configuration as that of the controller 1200 described with reference to FIG. 13 and is configured to control the plurality of memory chips of the semiconductor memory device 2100 through the plurality of channels CH1 to CHk.

In FIG. 14, a description has been made such that a plurality of semiconductor memory chips are coupled to a single channel. However, it will be understood that the memory system 2000 may be modified such that a single semiconductor memory chip is coupled to a single channel.

Figure 15:
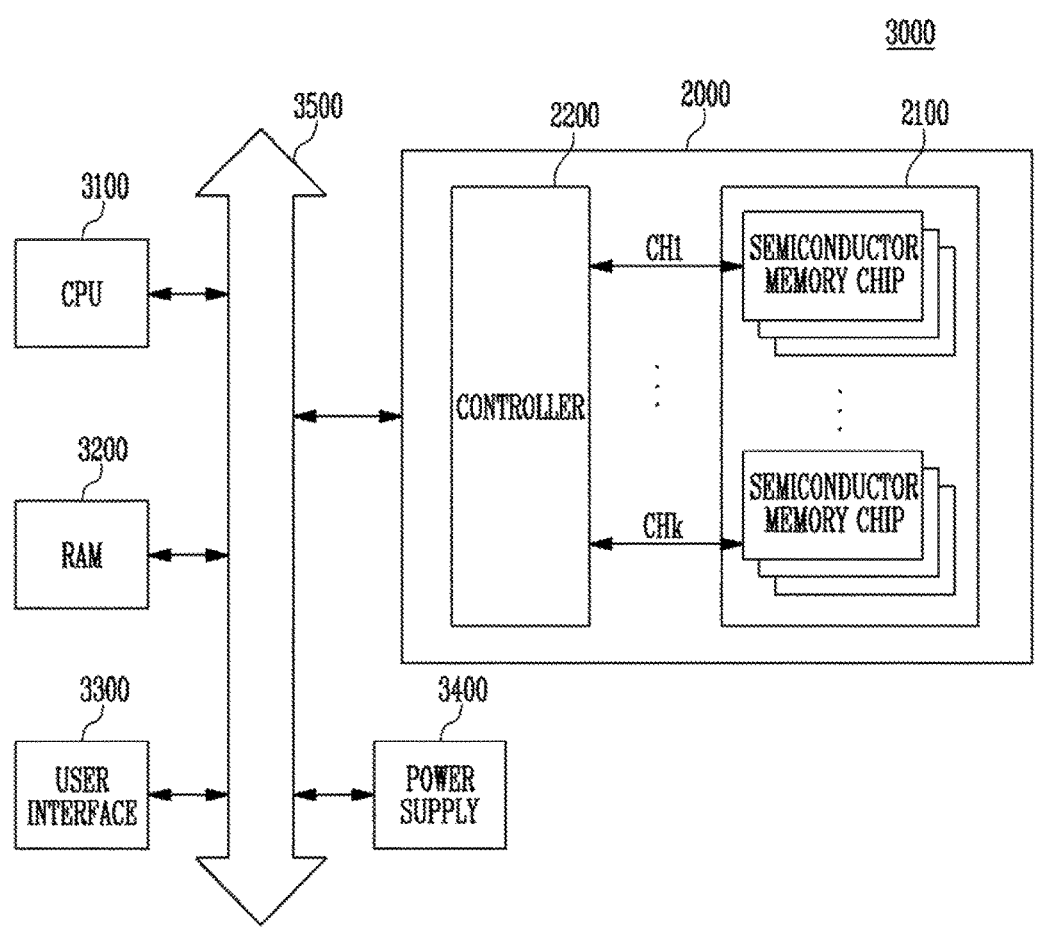
FIG. 15 is a block diagram illustrating a computing system including the memory system described with reference to FIG. 14.

FIG. 15 is a block diagram showing a computing system including the memory system described with reference to FIG. 14.

Referring to FIG. 15, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 15, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 15, the memory system 2000 described with reference to FIG. 14 is illustrated as being provided. However, the memory system 2000 may be replaced with the memory system 1500 described with reference to FIG. 13. In an embodiment, the computing system 3000 may be configured to include all of the memory systems 1500 and 2000 described with reference to FIGS. 13 and 14.

In accordance with the embodiments of the present disclosure, there are provided a semiconductor memory device which has improved reliability, and a method of operating the semiconductor memory device.

Although the exemplary embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings will aid those with ordinary knowledge in the art to more clearly understand the present disclosure rather than limiting the bounds of the present disclosure. That is, one of ordinary skill in the art to which the present disclosure belongs will be able to easily understand that various modifications are possible based on the technical scope of the present disclosure.

Exemplary embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present invention as set forth in the following claims.

What is claimed is:

1. A semiconductor memory device, comprising:
   a memory cell array including a plurality of memory cells;
   a peripheral circuit configured to perform a program operation, which includes a plurality of program loops, on selected memory cells among the plurality of memory cells; and
   a control circuit configured to control the peripheral circuit so that a program voltage applied to a selected word line, to which the selected memory cells are coupled, is stepwisely increased from a program start voltage to a target program voltage by a step voltage, which is a voltage increment of the program voltage, during a preset time period of a respective program loop,
   wherein the control circuit comprises a program voltage control unit configured to update the step voltage according to Equation 1 at a start of each step interval defined by Equation 2 given a total of $2^N$ steps corresponding to the preset time period as follows:

$$Vstep(n) = \frac{(VPGM\_TARGET - VCURRENT)}{REMAINING\ STEPS}, \quad [\text{Equation 1}]$$

where "VPGM TARGET" represents the target program voltage, "VCURRENT" represents a current program voltage of the selected word line, "REMAINING STEPS" represents a number of remaining steps in the total steps at the start of each step interval, and "n" is a natural number ranging from 1 to N+1; and $$n^{th}\ \text{step interval (unit: step)} = \begin{cases} 2^{N+1-n} - 2^{N-n}|_{n=1}^{N}, \\ 1|_{n=N+1} \end{cases} \quad [\text{Equation 2}]$$

where "n" is a natural number ranging from 1 to N+1.

2. The semiconductor memory device according to claim 1, wherein the program voltage control unit comprises:
   a step counter circuit configured to count the number of remaining steps as the program voltage is applied to the selected word line; and
   a step voltage calculation unit configured to update the step voltage according to the equation 1.

3. The semiconductor memory device according to claim 1, wherein the preset time period is equally applied to the plurality of program loops.

4. The semiconductor memory device according to claim 1, wherein each of the total steps has a length corresponding to one of one period and a half period of a clock signal of the semiconductor memory device.

5. A method for operating a semiconductor memory device, comprising:
   applying a pass voltage to all word lines;
   when a voltage of the word lines reaches the pass voltage, applying a program start voltage higher than the pass voltage to a selected word line among the word lines; and
   when the voltage of the selected word line reaches the program start voltage, applying a program voltage to the selected word line during a preset time period of each of a plurality of program loops,
   wherein the program voltage is stepwisely increased from the program start voltage to a target program voltage by a step voltage, which is a voltage increment of the program voltage, during the preset time period, and
   wherein the applying the program voltage comprises updating the step voltage according to Equation 1 at a start of each step interval defined by Equation 2 given a total of $2^N$ steps corresponding to the preset time period as follows:

$$Vstep(n) = \frac{(VPGM\_TARGET - VCURRENT)}{REMAINING\ STEPS}, \quad [\text{Equation 1}]$$

where "VPGM TARGET" represents the target program voltage, "VCURRENT" represents a current program voltage of the selected word line, "REMAINING STEPS" represents a number of remaining steps in the total steps at the start of each step interval, and "n" is a natural number ranging from 1 to N+1; and $$n^{th} \text{ step interval (unit step)} = \begin{cases} 2^{N+1-n} - 2^{N-n}|_{n=1}^{N}, & \text{[Equation 2]} \\ 1|_{n=N+1} \end{cases}$$

where "n" is a natural number ranging from 1 to N+1.

6. The method according to claim 5, wherein the preset time is equally applied to the plurality of program loops.

7. The method according to claim 5, wherein each of the total steps has a length corresponding to one of one period and a half period of a clock signal of the semiconductor memory device.

* * * * *